(12) United States Patent
Gong et al.

(10) Patent No.: US 7,777,527 B2
(45) Date of Patent: Aug. 17, 2010

(54) PHASE DETECTION APPARATUS

(75) Inventors: Jung Chul Gong, Seoul (KR); Byoung Own Min, Gyunggi-Do (KR); Yu Jin Jang, Gyunggi-Do (KR); Seung Kon Kong, Gyunggi-Do (KR); Sang Cheol Shin, Gyunggi-Do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 19 days.

(21) Appl. No.: 12/200,031

(22) Filed: Aug. 28, 2008

(65) Prior Publication Data

US 2009/0058467 A1 Mar. 5, 2009

(30) Foreign Application Priority Data

Aug. 29, 2007 (KR) ...................... 10-2007-0087195

(51) Int. Cl.
*G01R 29/00* (2006.01)
*H03D 3/00* (2006.01)
*H03D 9/00* (2006.01)
(52) U.S. Cl. ......................................................... 327/2
(58) Field of Classification Search ...................... 327/2
See application file for complete search history.

(56) References Cited

U.S. PATENT DOCUMENTS 6,496,554 B1 * 12/2002 Ahn ........................... 375/376
7,046,042 B1 5/2006 Dino et al.
2006/0214698 A1 * 9/2006 Cho .............................. 327/3

FOREIGN PATENT DOCUMENTS

KR 1019960012921 B1 9/1996

* cited by examiner

*Primary Examiner*—Lincoln Donovan
*Assistant Examiner*—John W Poos
(74) *Attorney, Agent, or Firm*—Lowe Hauptman Ham & Berner LLP

(57) ABSTRACT

There is provided a phase detection apparatus that can accurately detect a phase difference between an input signal and a reference signal even when the input signal and the reference signal have different duty cycles. A phase detection apparatus according to an aspect of the invention may include: a pulse generation unit generating a first pulse signal on an edge of an input pulse signal, and a second pulse signal based on an edge of a reference pulse signal having a predetermined phase; and a detection unit detecting a phase difference between the first pulse signal and the second pulse signal from the pulse generation unit.

7 Claims, 3 Drawing Sheets

PHASE DETECTION APPARATUS

CROSS-REFERENCE TO RELATED APPLICATIONS

This application claims the priority of Korean Patent Application No. 2007-0087195 filed on Aug. 29, 2007, in the Korean Intellectual Property Office, the disclosure of which is incorporated herein by reference.

BACKGROUND OF THE INVENTION

1. Field of the Invention

The present invention relates to phase detection apparatuses, and more particularly, to a phase detection apparatus that can accurately detect a phase difference between an input signal and a reference signal even though the input signal and the reference signal have different duty cycles.

2. Description of the Related Art

Recently, liquid crystal display (LCD) products have come into widespread use because they are small, lightweight, and thin. Backlight units that supply light are used in the LCD products. The LCD products use lamp driving signals for controlling the driving of lamps in the backlight unit, and horizontal and vertical synchronization signals used for images of the LCD.

If interference occurs between the lamp driving signal and the horizontal and vertical synchronization signals that are used in the LCD product, the screen shakes, and that is called a "waterfall". In order to prevent this waterfall on the screen, a phase detector is used to synchronize the signals used in the LCD product with a predetermined reference signal such that the interference between the lamp driving signal and the horizontal and vertical synchronization signals can be avoided.

However, according to the related art, when a phase detector detects a phase difference between an input signal and a reference signal, if the input signal and the reference signal have different duty cycles, the phase detector detects a phase difference corresponding to a duty-cycle difference between the input signal and the reference signal even through the input signal and the reference signal are synchronized with each other.

SUMMARY OF THE INVENTION

An aspect of the present invention provides a phase detection apparatus that can accurately detect a phase difference between an input signal and a reference signal even though the input signal and the reference signal have different duty cycles.

According to an aspect of the present invention, there is provided a phase detection apparatus including: a pulse generation unit generating a first pulse signal on an edge of an input pulse signal, and a second pulse signal based on an edge of a reference pulse signal having a predetermined phase; and a detection unit detecting a phase difference between the first pulse signal and the second pulse signal from the pulse generation unit.

The pulse generation unit may include: a first pulse generator generating the first pulse signal synchronized with a rising edge of the input pulse signal; and a second pulse generator generating the second pulse signal synchronized with a rising edge of the reference pulse signal.

The first pulse generator may include: a first inverter inverting a signal level of the input pulse signal; a first delay delaying the input pulse signal whose signal level is inverted by the first inverter by a predetermined amount of time; and a first AND gate performing an AND operation of the signal level of the input pulse signal and a signal level of the delayed input pulse signal by the first delay, and the second pulse generator may include: a second inverter inverting a signal level of the reference pulse signal; a second delay delaying the reference pulse signal inverted whose signal level is inverted by the second inverter by a predetermined amount of time; and a second AND gate performing an AND operation of the signal level of the reference pulse signal and a signal level of the delayed reference pulse signal by the second delay.

A duty cycle of the first pulse signal may be the same as that of the second pulse signal.

The detection unit may include: a first RS latch having a terminal S through which the first pulse signal is input, a terminal R through which a feedback signal is input, and a terminal Q through which a result of comparison between the first pulse signal and the feedback signal is output; a second RS latch having a terminal S through which the second pulse signal is input, a terminal R through which a feedback signal is input, and a terminal Q through which a result of comparison between the second pulse signal and the feedback signal is output; an AND gate performing an AND operation of the result of comparison between the first and second RS latches; and a delay delaying a result of the AND operation performed by the AND gate by a predetermined amount of time.

The phase detection apparatus may further include: a third inverter inverting a signal level of the comparison result of the first RS latch; and a fourth inverter inverting a signal level of the comparison result of the second RS latch.

The phase detection apparatus may further include a charging/discharging unit charging or discharging a predetermined current according to a comparison signal whose signal level is inverted by the third inverter and a comparison signal whose signal level is inverted by the fourth inverter, and outputting a phase detection signal corresponding to a phase difference between the first pulse signal and the second pulse signal.

The charging/discharging unit may include: a first current source having a predetermined current; a first switch opening or closing a current carrying path of the current of the first current source according to the comparison signal whose signal level is inverted by the third inverter; a capacitor charging or discharging the current of the first current source according to whether the first switch is turned on or off; a second switch opening or closing a path of the current discharged from the capacitor according to the comparison signal whose signal level is inverted by the fourth inverter; and a second current source having a predetermined current.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
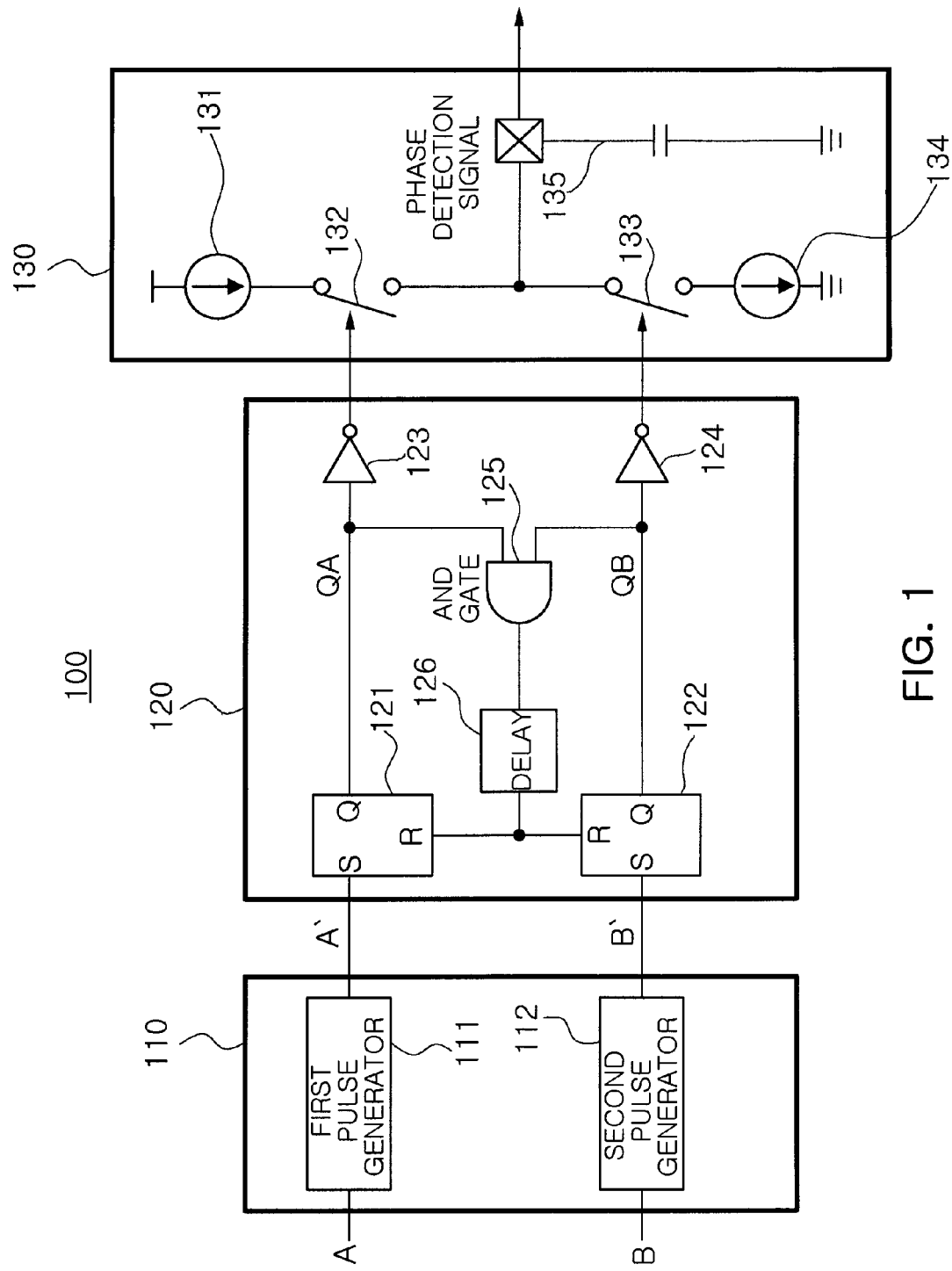
FIG. 1 is a configuration view illustrating a phase detection apparatus according to an exemplary embodiment of the invention.

Exemplary embodiments of the present invention will now be described in detail with reference to the accompanying drawings.

The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a configuration view illustrating a phase detection apparatus according to an exemplary embodiment of the invention.

Referring to FIG. 1, a phase detection apparatus 100 includes a pulse generation unit 110 and a detection unit 120.

The pulse generation unit 110 includes a first pulse generator 111 and a second pulse generator 112. The first pulse generator 111 receives an input pulse signal A that has a variable duty cycle and a predetermined phase. The second pulse generator 112 receives a reference pulse signal B that has a predetermined phase and a predetermined duty cycle.

The first pulse generator 111 generates a first pulse signal on an edge of the input pulse signal A. The second pulse generator 112 generates a second pulse signal on an edge of the reference pulse signal B.

Figure 2:
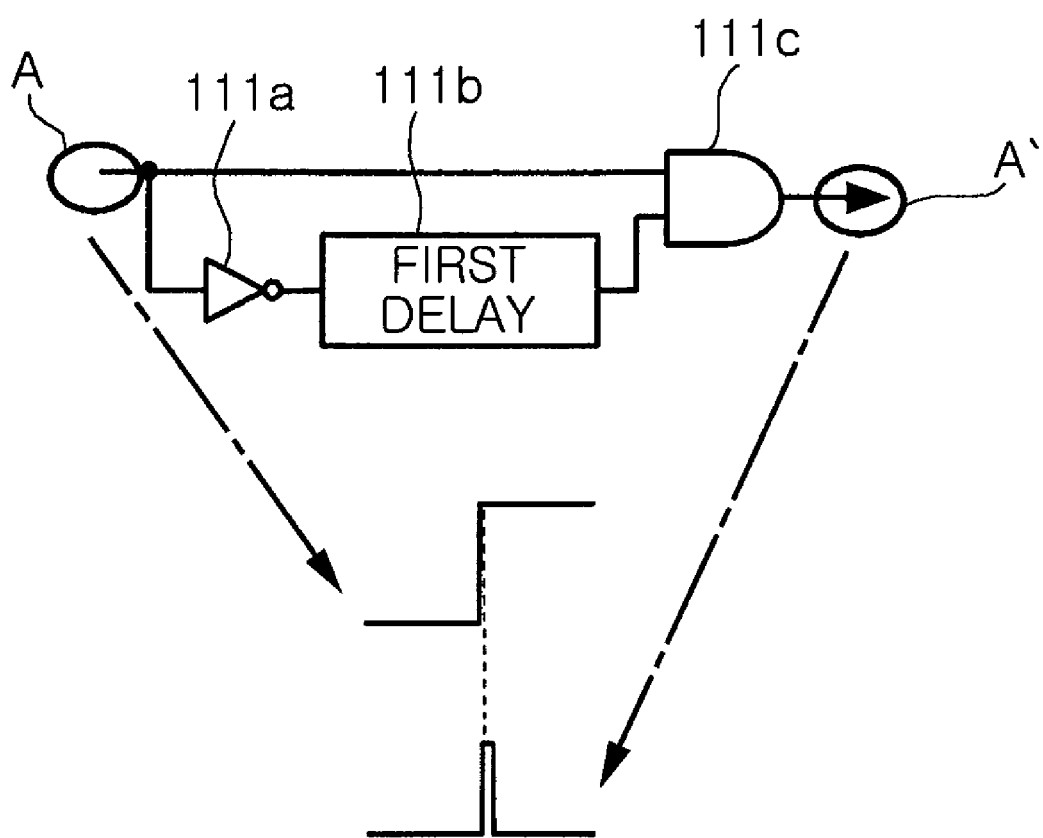
FIG. 2 is a configuration view illustrating a pulse generator used in the phase detection apparatus according to the exemplary embodiment of the invention.

FIG. 2 is a configuration view illustrating a pulse generator used in the phase detection apparatus according to the embodiment to the invention.

Referring to FIG. 2, the first pulse generator 111 includes a first inverter 111a, a first delay 111b, and a first AND gate 111c.

The first inverter 111a inverts a signal level of the input pulse signal A. Then, the first delay 111b delays the input pulse signal A whose signal level is inverted by the first inverter 111a by a predetermined amount of time. The first AND gate 111c performs an AND operation of the signal level of the input pulse signal A and a signal level of the delayed input pulse signal A by the first delay 111b. Then, the first AND gate 111c outputs a first pulse signal A' that is synchronized with a rising edge of the input pulse signal A.

An ON-period of the first pulse signal A' is determined according to the delay time of the first delay 111b.

Though not shown in FIG. 2, the second pulse generator 112 may include a second inverter, a second delay, and a second AND gate, each of which performs the same function as that of the first pulse generator 111. The second pulse generator 112 may output a second pulse signal B' that is synchronized with a rising edge of the reference pulse signal B. Further, by causing a delay time of the second delay to be equal to the delay time of the first delay 111b, the first pulse signal A' and the second pulse signal B' can have the same duty cycle.

Referring to FIG. 1, the detection unit 120 includes a first RS latch 121, a second RF latch 122, a first inverter 123, a second inverter 124, an AND gate 125, and a delay 126.

The first RS latch 121 includes a terminal S through which the first pulse signal A' is input, a terminal R through which a feedback signal is input, and a terminal Q through which a result of a logical operation of the signal level of the first pulse signal A' and a signal level of the feedback signal is output.

In the same manner, the second RS latch 122 includes a terminal S through which the second pulse signal B' is input, a terminal R through which the feedback signal is input, and a terminal Q through which a result of a logical operation of the signal level of the second pulse signal B' and the signal level of the feedback signal is output.

The first inverter 123 inverts a signal level of an output signal from the first RS latch 121. The second inverter 124 inverts a signal level of an output signal from the second RS latch 122.

The AND gate 125 performs an AND operation of the output signals from the first and second RS latches 121 and 122. The delay 126 delays a result of the AND operation performed by the AND gate 125 by a predetermined amount of time, and supplies the delayed result as the feedback signal.

Meanwhile, the phase detection apparatus 100 according to the embodiment of the invention may further include a charging/discharging unit 130.

The charging/discharging unit 130 includes a first current source 131, a first switch 132, a second switch 133, a second current source 134, and a capacitor 135.

The first current source 131 has a predetermined current. The first switch 132 opens or closes a current carrying path from the first current source 131 according to an output signal whose signal level is inverted by the first inverter 123. The capacitor 135 charges or discharges the current from the first current source 131 according to the switching operation of the first switch 132, and outputs a phase detection signal corresponding to a phase difference between the input pulse signal A and the reference pulse signal B.

The second switch 133 opens or closes a current discharging path of the current charged in the capacitor 135 according to an output signal whose signal level is inverted by the second inverter 124. The second current source 134 has a current corresponding to the current from the capacitor 135.

Figure 3A:
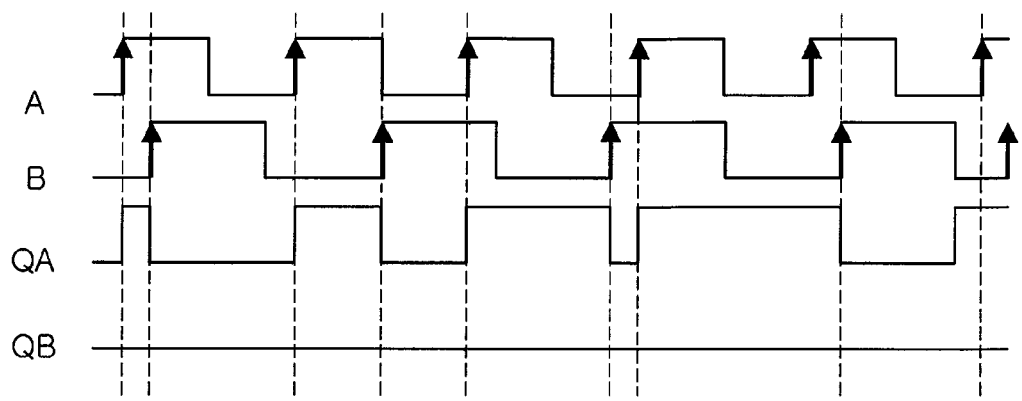
FIGS. 3A to 3C are timing charts illustrating signal waveforms of components of the phase detection apparatus with the timing between an input pulse signal and a reference pulse signal according to the exemplary embodiment of the invention.
Figure 3B:
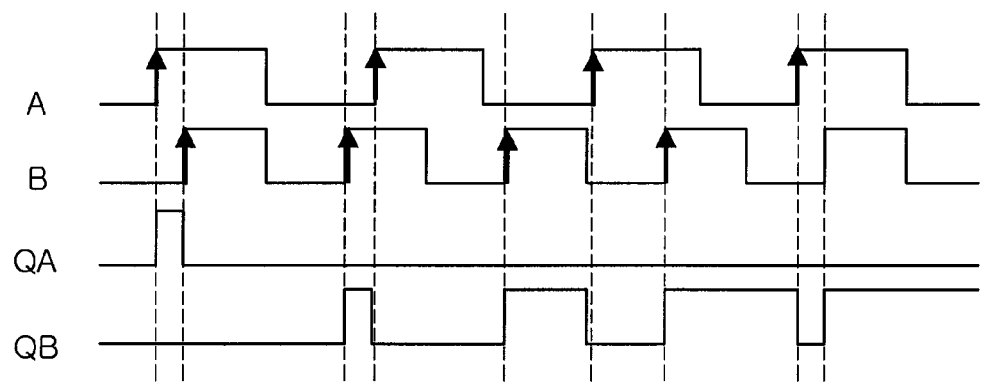
Figure 3C:
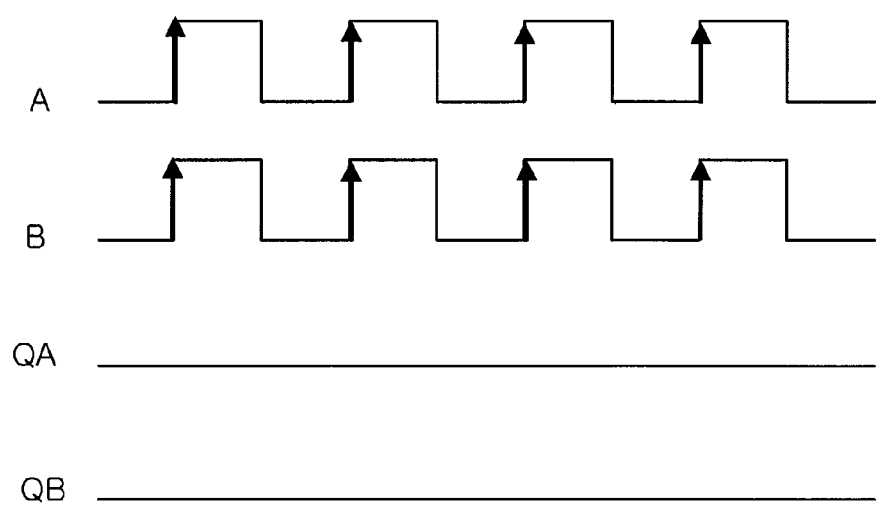

FIGS. 3A to 3C are timing charts illustrating signal waveforms of components of the phase detection apparatus with the timing between an input pulse signal and a reference pulse signal according to an exemplary embodiment of the invention.

In FIG. 3A, the input pulse signal A leads the reference pulse signal B. In FIG. 3B, the input pulse signal A lags the reference pulse signal B. In FIG. 3C, the input pulse signal A and the reference pulse signal B are phase locked to each other.

Referring to FIGS. 1, 2, 3A, and 3B, when the input pulse signal A leads the reference pulse signal B, or when the input pulse signal A lags the reference pulse signal B, the phase detection apparatus according to the embodiment of the invention accurately detects a phase difference between the input pulse signal A and the reference pulse signal B. Referring to FIG. 3C, even when the input pulse signal A and the reference pulse signal B have different duty cycles, if the input pulse signal A and the reference pulse signal B are accurately phase locked to each other, there is no phase difference.

As set forth above, according to the exemplary embodiment of the invention, even when an input signal and a reference signal have different duty cycles, a phase difference between the input signal and the reference signal can be accurately detected by using pulse signals on edges of the input signal and the reference signal.

While the present invention has been shown and described in connection with the exemplary embodiments, it will be apparent to those skilled in the art that modifications and variations can be made without departing from the spirit and scope of the invention as defined by the appended claims.

What is claimed is:

1. A phase detection apparatus comprising:
   a pulse generation unit generating a first pulse signal on an edge of an input pulse signal, and a second pulse signal based on an edge of a reference pulse signal having a predetermined phase; and
   a detection unit detecting a phase difference between the first pulse signal and the second pulse signal from the pulse generation unit;
   wherein the pulse generation unit comprises:
   a first pulse generator generating the first pulse signal synchronized with a rising edge of the input pulse signal; and
   a second pulse generator generating the second pulse signal synchronized with a rising edge of the reference pulse signal;
   wherein the first pulse generator comprises:
   a first inverter inverting a signal level of the input pulse signal;
   a first delay delaying the input pulse signal whose signal level is inverted by the first inverter by a predetermined amount of time; and
   a first AND gate performing an AND operation of the signal level of the input pulse signal and a signal level of the delayed input pulse signal by the first delay, and
   the second pulse generator comprises:
   a second inverter inverting a signal level of the reference pulse signal;
   a second delay delaying the reference pulse signal inverted whose signal level is inverted by the second inverter by a predetermined amount of time; and
   a second AND gate performing an AND operation of the signal level of the reference pulse signal and a signal level of the delayed reference pulse signal by the second delay.

2. The phase detection apparatus of claim 1, wherein a duty cycle of the first pulse signal is the same as that of the second pulse signal.

3. The phase detection apparatus of claim 1, wherein the detection unit comprises:
   a first RS latch having a terminal S through which the first pulse signal is input, a terminal R through which a feedback signal is input, and a terminal Q through which a result of comparison between the first pulse signal and the feedback signal is output;
   a second RS latch having a terminal S through which the second pulse signal is input, a terminal R through which a feedback signal is input, and a terminal Q through which a result of comparison between the second pulse signal and the feedback signal is output;
   an AND gate performing an AND operation of the result of comparison between the first and second RS latches; and
   a delay delaying a result of the AND operation performed by the AND gate by a predetermined amount of time.

4. The phase detection apparatus of claim 3, further comprising:
   a third inverter inverting a signal level of the comparison result of the first RS latch; and
   a fourth inverter inverting a signal level of the comparison result of the second RS latch.

5. The phase detection apparatus of claim 4, further comprising a charging/discharging unit charging or discharging a predetermined current according to a comparison signal whose signal level is inverted by the third inverter and a comparison signal whose signal level is inverted by the fourth inverter, and outputting a phase detection signal corresponding to a phase difference between the first pulse signal and the second pulse signal.

6. The phase detection apparatus of claim 5, wherein the charging/discharging unit comprises:
   a first current source having a predetermined current;
   a first switch opening or closing a current carrying path of the current of the first current source according to the comparison signal whose signal level is inverted by the third inverter;
   a capacitor charging or discharging the current of the first current source according to whether the first switch is turned on or off;
   a second switch opening or closing a path of the current discharged from the capacitor according to the comparison signal whose signal level is inverted by the fourth inverter; and
   a second current source having a predetermined current.

7. A phase detection apparatus comprising:
   a pulse generation unit generating a first pulse signal on an edge of an input pulse signal, and a second pulse signal based on an edge of a reference pulse signal having a predetermined phase;
   a detection unit detecting a phase difference between the first pulse signal and the second pulse signal from the pulse generation unit; and
   a charging/discharging unit charging or discharging a predetermined current according to a comparison signal whose signal level is inverted by the third inverter and a comparison signal whose signal level is inverted by the fourth inverter, and outputting a phase detection signal corresponding to a phase difference between the first pulse signal and the second pulse signal;
   wherein the detection unit comprises:
   a first RS latch having a terminal S through which the first pulse signal is input, a terminal R through which a feedback signal is input, and a terminal Q through which a result of comparison between the first pulse signal and the feedback signal is output;
   a second RS latch having a terminal S through which the second pulse signal is input, a terminal R through which a feedback signal is input, and a terminal Q through which a result of comparison between the second pulse signal and the feedback signal is output;
   an AND gate performing an AND operation of the result of comparison between the first and second RS latches;
   a delay delaying a result of the AND operation performed by the AND gate by a predetermined amount of time;
   a third inverter inverting a signal level of the comparison result of the first RS latch; and
   a fourth inverter inverting a signal level of the comparison result of the second RS latch;
   wherein the charging/discharging unit comprises:
   a first current source having a predetermined current;
   a first switch opening or closing a current carrying path of the current of the first current source according to the comparison signal whose signal level is inverted by the third inverter;
   a capacitor charging or discharging the current of the first current source according to whether the first switch is turned on or off;
   a second switch opening or closing a path of the current discharged from the capacitor according to the comparison signal whose signal level is inverted by the fourth inverter; and
   a second current source having a predetermined current.

* * * * *